United States Patent
Wang et al.

(10) Patent No.: US 9,485,029 B2
(45) Date of Patent: Nov. 1, 2016

(54) MULTINARY SIGNALING BASED CODED MODULATION FOR ULTRA-HIGH-SPEED OPTICAL TRANSPORT

(71) Applicant: NEC Laboratories America, Inc., Princeton, NJ (US)

(72) Inventors: Ting Wang, West Windsor, NJ (US); Ivan Djordjevic, Tuscon, AZ (US)

(73) Assignee: NEC Corporation (JP)

( * ) Notice: Subject to any disclaimer, the term of this patent is extended or adjusted under 35 U.S.C. 154(b) by 0 days.

(21) Appl. No.: 14/747,743

(22) Filed: Jun. 23, 2015

(65) Prior Publication Data

US 2016/0105243 A1    Apr. 14, 2016

Related U.S. Application Data

(60) Provisional application No. 62/063,112, filed on Oct. 13, 2014.

(51) Int. Cl.
*H04B 10/04* (2006.01)
*H04B 10/532* (2013.01)
(Continued)

(52) U.S. Cl.
CPC ......... *H04B 10/532* (2013.01); *H03M 13/255* (2013.01); *H03M 13/6325* (2013.01)

(58) Field of Classification Search
CPC H04B 10/532; H04B 10/548; H04B 10/516; H04B 10/5161; H04B 10/614; H04J 14/06; H04J 14/02; H04J 14/04

USPC ....... 398/183, 184, 188, 192, 193, 194, 195, 398/202, 208, 205, 152, 65, 158, 159, 79, 398/76

See application file for complete search history.

(56) References Cited

U.S. PATENT DOCUMENTS 8,234,538 B2 * 7/2012 Djordjevic ......... H03M 13/1111
714/755
2012/0257895 A1 * 10/2012 Djordjevic ........... H04B 10/548
398/65

(Continued)

OTHER PUBLICATIONS

Djordjevic et al, On the Irregular Nonbinary QC-LDPC-Coded Hybrid Multidimensional OSCD-Modulation Enabling Beyond 100 Tb/s Optical Transport, Journal of Lightwave Technology, vol. 31, No. 16, Aug. 15, 2013.

(Continued)

*Primary Examiner* — Hanh Phan
(74) *Attorney, Agent, or Firm* — Joseph Kolodka

(57) ABSTRACT

Systems and methods for communication using an optical transmission system having optical transmitters and receivers includes performing a low-density parity-check (LDPC) encoding; performing nonbinary $p^m$-ary signaling, where p is a prime larger than 2; taking m p-ary symbols at a time and selecting a point from $p^m$-ary signal constellation; after up-sampling and driving amplification, using coordinates of the $p^m$-ary constellation as input of I/Q modulator x (y); combining two independent $p^m$-ary streams corresponding to x and y-polarization states by a polarization beam combiner (PBS) and transmitting data over the optical transmission system.

20 Claims, 9 Drawing Sheets

(51) Int. Cl.
*H03M 13/25* (2006.01)
*H03M 13/00* (2006.01)

(56) References Cited

U.S. PATENT DOCUMENTS

2013/0089326 A1* 4/2013 Djordjevic .............. H04J 14/04
398/44
2015/0071640 A1* 3/2015 Batshon ............. H04B 10/5161
398/91

OTHER PUBLICATIONS

Djordjevic et al, Multidimensional Signaling and Coding Enabling Multi-Tb/s Optical Transport and Networking, IEEE Signal Processing Magazine Mar. 2014.
Liu et al, Digital coherent superposition for performance improvement of spatially multiplexed coherent optical OFDM superchannels, Dec. 10, 2012 / vol. 20, No. 26 / Optics Express B595.

* cited by examiner

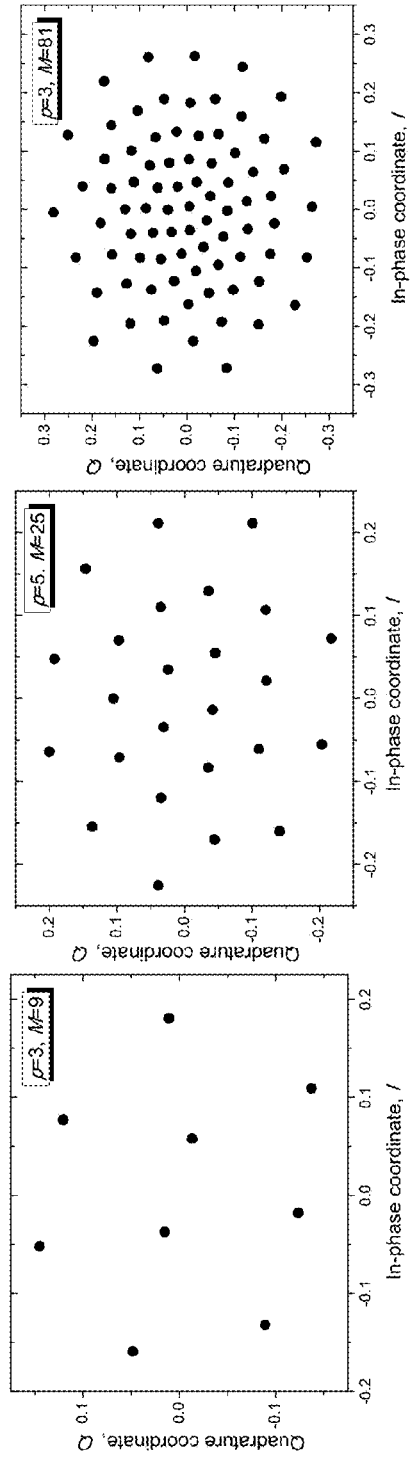
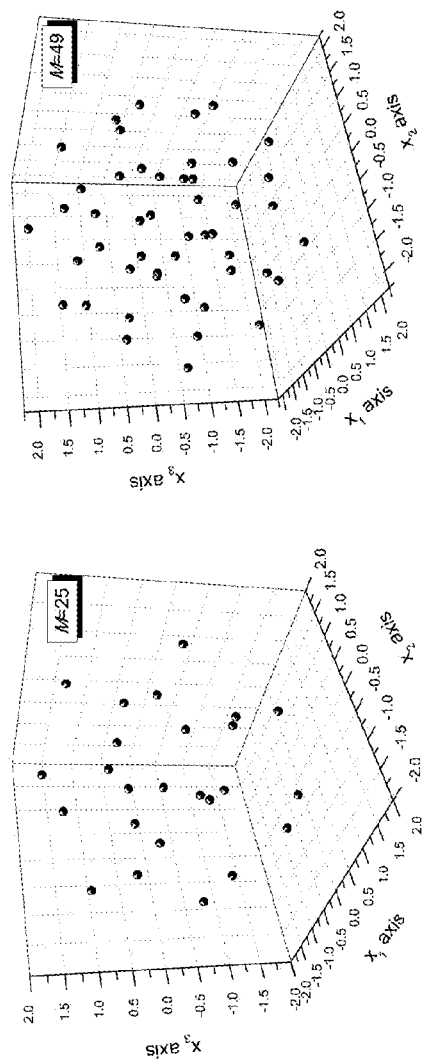
FIG. 2A
FIG. 2B
FIG. 2C
FIG. 2D
FIG. 2E

MULTINARY SIGNALING BASED CODED MODULATION FOR ULTRA-HIGH-SPEED OPTICAL TRANSPORT

BACKGROUND

The present invention relates to optical transport systems.

The exponential internet traffic growth projections place enormous transmission rate demand on the underlying information infrastructure at every level. As the response, the 100 Gb/s Ethernet (100 GbE) standard has been adopted recently (IEEE 802.3ba), and 400 GbE and 1 Tb/s Ethernet (1 TbE) are currently under study. Terabit optical Ethernet technologies will be affected by limited bandwidth of information-infrastructure, high energy consumption, and heterogeneity of optical networking infrastructure. To reach beyond 1 Tb/s serial date rates, a huge signal constellation sizes are required for polarization-division multiplexed (PDM) single-carrier QAM systems, with commercially achievable symbol rates. Furthermore, in the context of high-speed optical communication systems, not only the performance of advanced coded modulation schemes but also their complexity plays a crucial role. In addition, security issues of the future optical networks should be addressed rather than later. Thus, such schemes need to be designed meticulously to address both issues simultaneously and in and effective manner.

SUMMARY

In one aspect, a method for Multinary Signaling based Coded Modulation for Ultra-High-Speed Optical Transport is disclosed. The method covers communication using an optical transmission system having optical transmitters and receivers and further includes performing a low-density parity-check (LDPC) encoding; performing nonbinary $p^m$-ary signaling, where p is a prime larger than 2; taking m p-ary symbols at a time and selecting a point from pm-ary signal constellation; after up-sampling and driving amplification, using coordinates of the $p^m$-ary constellation as input of I/Q modulator x (y); combining two independent $p^m$-ary streams corresponding to x and y-polarization states by a polarization beam combiner (PBS) and transmitting data over the optical transmission system.

Implementation of the above aspect can include one or more of the following. Instead of conventional binary and $2^m$-ary signaling (m is an integer larger than or equal to 1) we use the nonbinary $p^m$-ary signaling instead, where p is a prime larger than 2. With $p^m$-ary signaling we can improve the spectral efficiency of conventional $2^m$-ary schemes by at least $\log_2 p$ times for the same bandwidth occupancy. At the same time the energy-efficiency of $p^m$-ary signaling scheme is much better than that of $2^m$-ary signaling scheme based on binary representation of data. We further proposed the energy-efficient coded modulation for $p^m$-ary signaling. The energy-efficient signal constellation design for $p^m$-ary signaling has been proposed as well. With the $p^m$-ary signaling in combination with energy-efficient signal constellation design, spectral-multiplexing, polarization-division multiplexing, and orthogonal division multiplexing (ODM), we can achieve multi-Pb/s serial optical transport without a need for introduction of spatial-division multiplexing. By using the spatial modes, in tandem with multinary signaling based coded modulation, beyond 10 Pb/s serial optical transport is achievable. Since the Slepian sequences are mutually orthogonal regardless of the sequence order, while occupying the fixed bandwidth they have been used to provide an additional degree of freedom with a help of properly designed fiber Bragg gratings (FBGs). The Slepian sequences based FBGs are also used to provide all optical encryption. The target impulse responses of FBGs belong to the class of Slepian sequences, which are mutually orthogonal regardless of the sequence order, while occupying the fixed bandwidth. By randomly selecting an FBG with impulse response from the set of Slepian sequences, we ensure that transmitted sequence is secure as the eavesdropper does not know which FBG has been used.

BRIEF DESCRIPTION OF THE DRAWINGS

FIGS. 2A-2E show exemplary multinary signaling based constellations. FIGS. 2A-2C corresponds to two-dimensional (2D) constellations, while FIGS. 2D and 2F to three-dimensional signal (3-D) constellations.

FIG. 4A shows exemplary block diagram of transmitter configuration while

DESCRIPTION

Multinary Signaling Based Coded Modulation for Optical Transmission

Figure 1A:
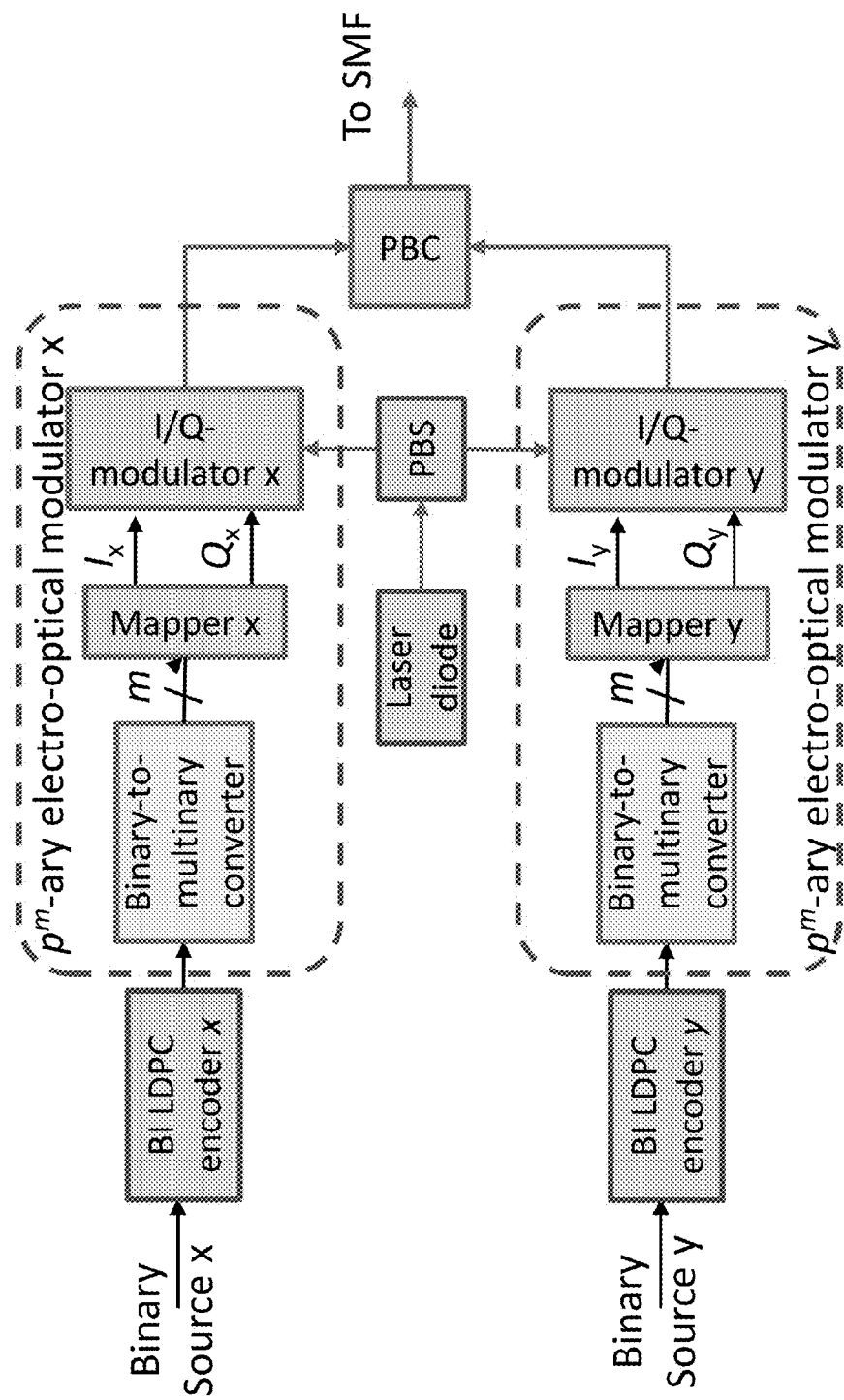
FIGS. 1A-1B shows exemplary transmitter and receiver configurations using multinary signaling based coded modulation compatible with PDM.
Figure 1B:
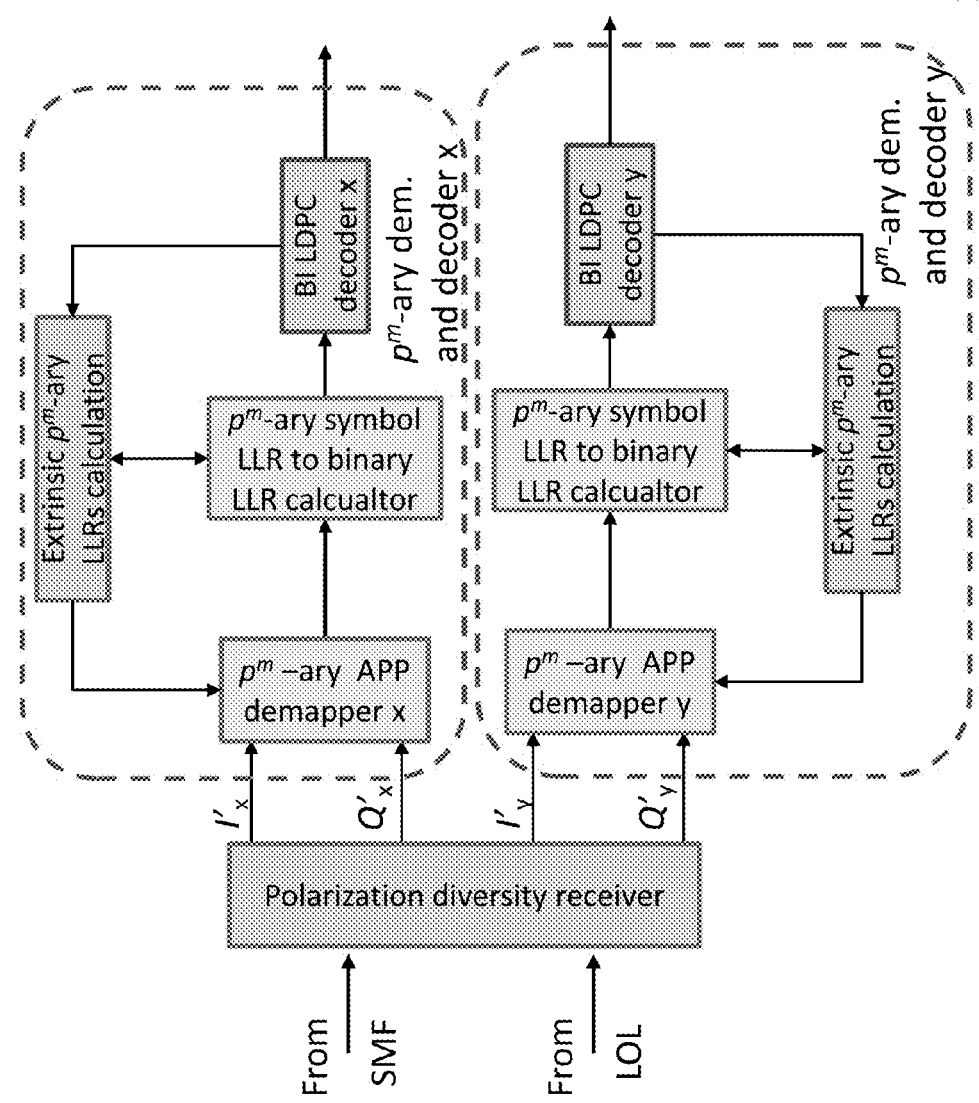

FIGS. 1A-1B shows exemplary transmitter and receiver configurations using multinary signaling based coded modulation compatible with PDM. In these figures, PBS(C) represents a polarization beam splitter (combiner), LOL represents a local oscillator laser, and APP stands for a posteriori probability.

The multinary signaling based coded modulation scheme is described in the context of polarization-division multiplexing (PDM). Since multinary LDPC coding over GF(p), where p is the prime larger than 2, has potentially high decoding complexity, we use two binary (BI) LDPC encoders corresponding to both polarization states. After LDPC encoding, as illustrated in FIG. 1A, we perform binary-to-multinary (p-ary) conversion. Mapper x (y) takes m p-ary symbols at a time and selects a point from $p^m$-ary signal constellation. After up-sampling and driving amplification, the coordinates of the $p^m$-ary constellation are used as input of I/Q modulator x (y). Two independent $p^m$-ary streams (corresponding to x- and y-polarization states) are then combined by polarization beam combiner (PBC) and transmitted over optical transmission system of interest. To facilitate the implementation in FPGA/ASIC hardware, multiple BI LDPC encoders might be used whose outputs are multiplexed together before binary-to-multinary conversion takes place. On receiver side, as illustrated in FIG. 1B, we first perform conventional polarization diversity coherent detection to get the corresponding projections along x-polarization ($I'_x$ and $Q'_x$) and y-polarization ($I'_y$ and $Q'_y$). The estimates of I- and Q-coordinates are passed to $p^m$-ary a posteriori probability (APP) demapper, which calculates $p^m$-ary symbol LLRs as follows:

$$\lambda(s_i^{(x,y)}) = \log\left[\frac{P(s_i^{(x,y)} \mid r^{(x,y)})}{P(s_0 \mid r^{(x,y)})}\right], \quad r^{(x,y)} = I'_{x,y} + jQ'_{x,y} \quad (1)$$

where $s_i^{(x,y)}$ is the transmitted $p^m$-ary signal constellation point at time instance i in either x- or y-polarization, while $s_0$ is the reference constellation point (such as $s_0=(0 \ldots 0)$). In (1), $P(s_i^{(x,y)}\mid r^{(x,y)})$ is determined by using the Bayes' rule:

$$P(s_i^{(x,y)} \mid r^{(x,y)}) = \frac{P(r^{(x,y)} \mid s_i^{(x,y)})P(s_i^{(x,y)})}{\sum_{s'} P(r^{(x,y)} \mid s')P(s')}, \quad (2)$$

where $P(s_i^{(x,y)})$ is the prior probability, equal to $1/p^m$ for uniform signaling. The conditional probability $P(r^{(x,y)}\mid s_i^{(x,y)})$ can be determined by estimation of histograms in the presence of uncompensated nonlinear effects. After the compensation of nonlinear phase noise the Gaussian approximation can be used. The number of bits required to represent a single $p^m$-ary symbol is $b=\lceil\log_2(p^m)\rceil$, where $\lceil z \rceil$ is the smallest integer larger than or equal to the enclosed quantity z. Let the j-th bit corresponding to the i-th symbol ($s_i^{(x,y)}$) in binary representation be denoted as $s_{ij}^{(x,y)}$, where $j\in[0, b-1]$. The j-th bit LLR of symbol $s_i^{(x,y)}$ is determined from symbol LLRs (1) by $$L(\hat{s}_{ij}^{(x,y)}) = \log\frac{\sum_{s_i:s_{ij}^{(x,y)}=0} \exp[\lambda(s_i^{(x,y)})]\exp\left(\sum_{s_i^{(x,y)}:s_{ik}^{(x,y)}=0,k\neq j} L_a(s_{ik}^{(x,y)})\right)}{\sum_{s_i^{(x,y)}:s_{ij}^{(x,y)}=1} \exp[\lambda(s_i^{(x,y)})]\exp\left(\sum_{s_i^{(x,y)}:s_{ik}^{(x,y)}=0,k\neq j} L_a(s_{ik}^{(x,y)})\right)}, \quad (3)$$

where with $L_a(s_{ik}^{(x,y)})$ we denoted the prior (extrinsic) information determined from the $p^m$-ary APP demapper. Therefore, the j-th position reliability in (3) is calculated as the logarithm of the ratio of a probability that $s_{ij}^{(x,y)}=0$ and probability that $s_{ij}^{(x,y)}=1$. In the nominator, the summation is done over all symbols $s_i^{(x,y)}$ having 0 at the position j, while in the denominator over all symbols $s_i^{(x,y)}$ having 1 at the position j. The inner summation in (3) is performed over all positions of symbol $s_i^{(x,y)}$, selected in the outer summation, for which $s_{ik}^{(x,y)}=0$, $k\neq j$. The j-th position LLRs are forwarded to corresponding binary LDPC decoder. To facilitate the implementation in FPGA/ASIC hardware, multiple BI LDPC decoders might be used in parallel whose outputs are multiplexed together before extrinsic information for the next global (APP-LDPC decoder) iteration is calculated. Finally, the prior $p^m$-ary symbol estimate can be obtained from $$\lambda_a(\hat{s}_i^{(x,y)}) = \sum_{j=0}^{b-1} L_{D,e}(\hat{s}_{ij}), \quad L_{D,e}(\hat{s}_{ij}^{(x,y)}) = L(s_{ij}^{(t)}) - L(s_{ij}^{(t-1)}) \quad (4)$$

where $L(s^{(t)}_{ij})$ denotes the LDPC decoder output in current iteration (iteration t). The iteration between the $p^m$-ary APP demapper and BI LDPC decoder is performed until the maximum number of iterations is reached, or the valid codewords are obtained.

The aggregate data rate of this scheme, when used in PDM context, is given by:

$$R_D = 2R_S R \log_2(p^m). \quad (5)$$

For instance, for 125-ary signaling, the aggregate data rate of this scheme for information symbol rate of 25 Giga symbols/s (25 GS/s), is 348.285 Gb/s. When this scheme is used in a tandem with three orthogonal subcarriers, the aggregate data rate of 1044.855 Gb/s can be achieved, and this scheme can be used to enable beyond 1 Tb/s serial optical transport for moderate OSNR-values. The spectral efficiency of the multinary scheme is $\log_2 p$ times higher than corresponding scheme based on binary signaling, for the same bandwidth occupancy. As an illustration, the improvement in spectral efficiency for p=7 will be $\log_2 7$ (=2.81) times. On the other hand, the multinary scheme can be used to improve the energy-efficiency, defined as the improvement in OSNR (per bit) at target BER when multinary signaling is used compared to the case when binary signaling based optical transmission is used instead.

In the rest of this section, we describe how to design the multinary signaling based constellation inspired by Monte Carlo method, which is suitable for medium signal constellation sizes. For large signal constellations, the vector-quantization-inspired signal constellation design should be used instead. To generate $p^m$-ary signal constellations, the first stage is also to use conventional Arimoto-Blahut algorithm to determine the optimum source distribution for a given optical channel. In the second stage, we first initialize the algorithm with a set of initial constellation points obtained from conventional QAM. After the initialization stage, we generate the training sequences from optimum source distribution and split them into the clusters of points according to the LLRs from constellation obtained in previous iteration. New constellation points are obtained as the center of mass of such obtained clusters. As an illustration, in FIG. 2A-2C we provide three signal constellations for different primes p and different signal constellation sizes $M=p^m$. FIGS. 2A-2E show exemplary multinary signaling based constellations. This FIGS. 2A-2C corresponds to 2D constellations. The multinary signaling based 2D constellations under where FIG. 2A applies p=3, M=9, FIG. 2B uses p=5, M=25, and FIG. 2C uses p=3, M=81. On the other hand, FIGS. 2D and 2E correspond to 3D constellations. The multinary 3D constellations under FIG. 3D applies p=5, M=25, while multinary 3D constellation under FIG. 3E applies p=7, M=49. For more than 2D dimensions Slepian sequences in electrical domain are used as electrical basis functions.

Figure 3:
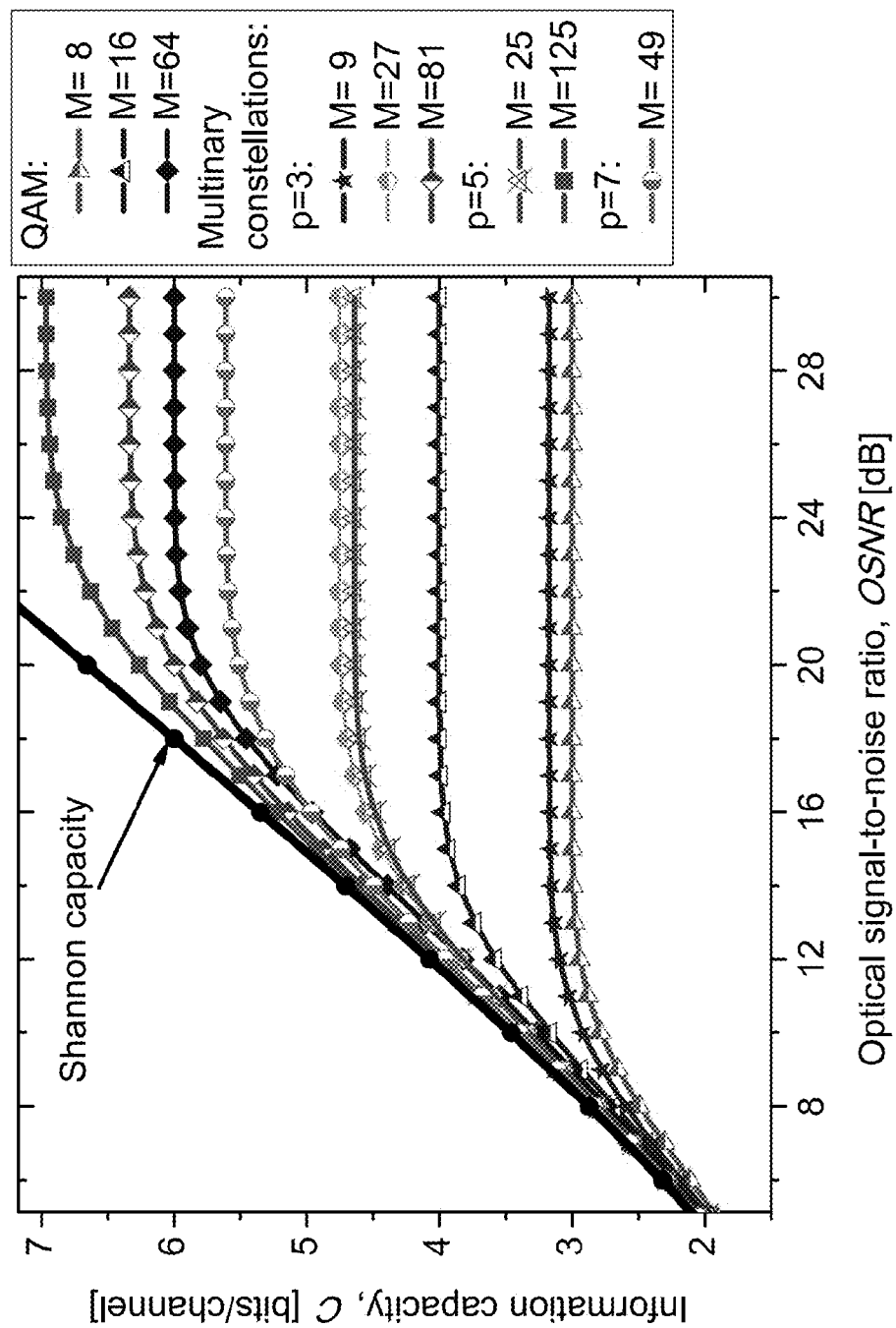
FIG. 3 shows exemplary information capacities of multinary signaling based schemes.

Multinary signaling based constellations closely approach Shannon capacity for low and medium OSNR-values, as shown in FIG. 3 for information capacities of multinary 2D signaling based schemes. In addition to closely approaching Shannon capacity, the schemes allow for finer granularity in spectral efficiency compared to conventional constellations (with signal constellation size being power of 2) indicating that the scheme are suitable for adaptive modulation and coding.

Figure 4A:
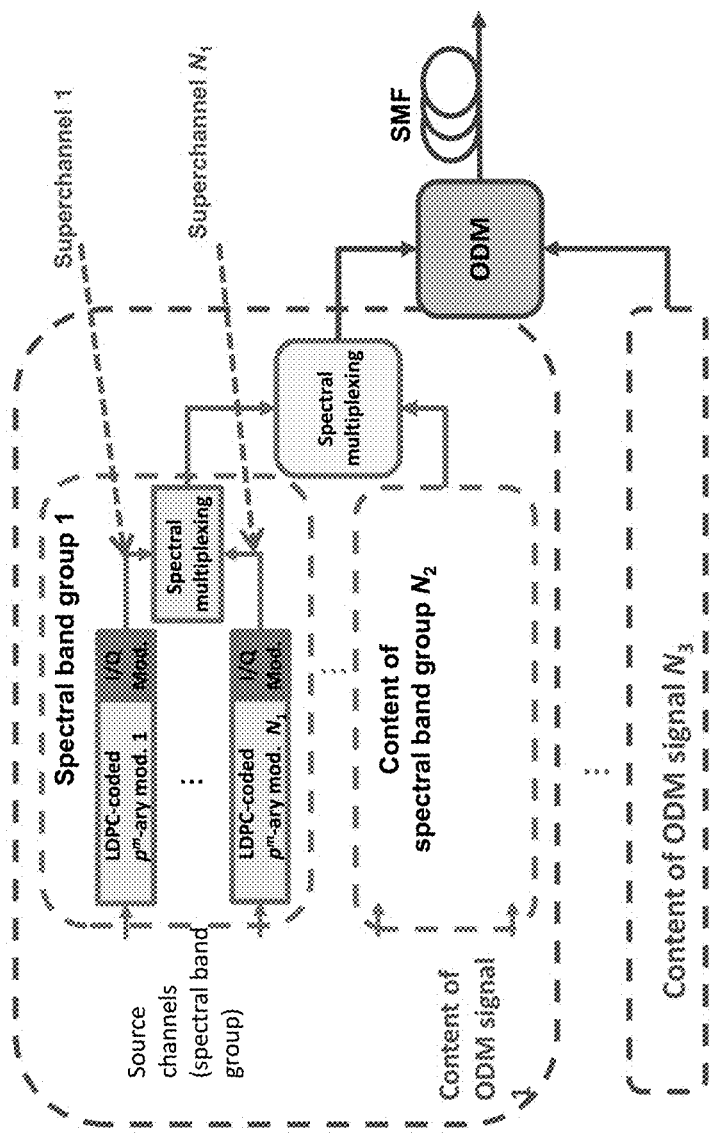
Figure 4B:
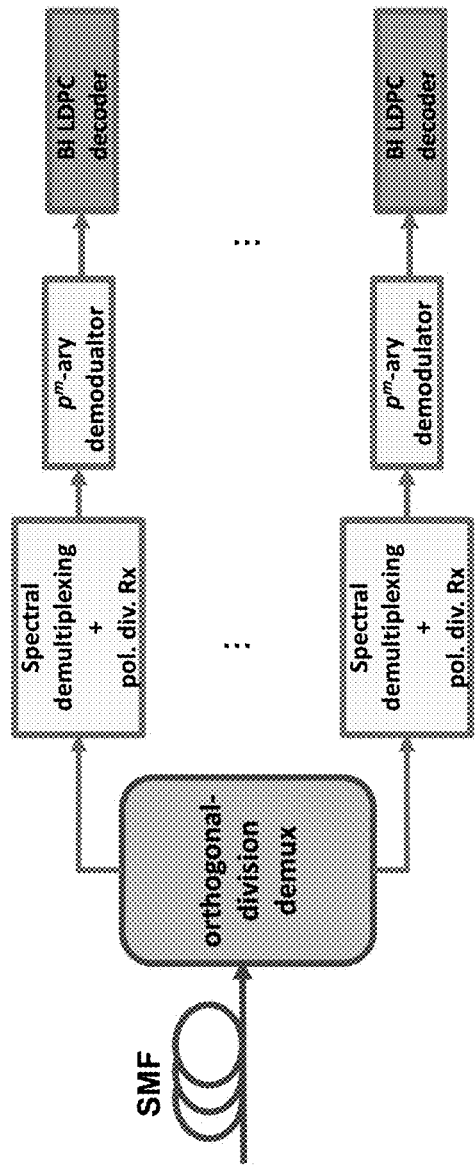
FIG. 4B shows an exemplary receiver configuration.

Beyond 1 Pb/s Serial Optical Transport Employing Multinary Signaling Based Coded Modulation The software-defined LDPC-coded $p^m$-ary signaling with spectral multiplexing and ODM that we have is shown in FIG. 4. FIG. 4A shows a block diagram of transmitter configuration while FIG. 4B shows details of receiver. The notation is as follows. N1: number of superchannels within the spectral band group; N2: number of spectral band groups; N3: number of ODM streams. Only single polarization is fully shown to facilitate explanations.

The LDPC-coded $p^m$-ary data streams are obtained as described in FIG. 1. After DACs, the corresponding in-phase and quadrature signals are used as inputs to I/Q modulator. The spectral multiplexing is then performed by using the all optical OFDM approach. The corresponding spectral band-group signals are then coupled into the orthogonal-division multiplexer, as shown in FIG. 4A. The configurations of Slepian-FBG based orthogonal division multiplexer (ODM) and demultiplexer can be determined. Namely, the Slepian sequences, are mutually orthogonal regardless of the sequence order, while occupying the fixed bandwidth. Given the orthogonality of impulse response of Slepian sequences, they can be used to provide an additional degree of freedom with a help of properly designed FBGs. The Slepian sequences based FBGs are also used to provide all optical encryption. At the receiver side, see FIG. 4B, after the orthogonal-division demultiplexing, every ODM projection is forwarded to all-optical OFDM receiver followed by the conventional polarization-diversity receiver, which provides the projections along both polarizations and in-phase/quadrature channels. Notice that all-optical OFDM has been used here for multiplexing of independent optical signals over orthogonal optical OFDM supercarriers rather than for modulation. The re-sampled outputs represent projections along the corresponding basis functions.

Figure 5A:
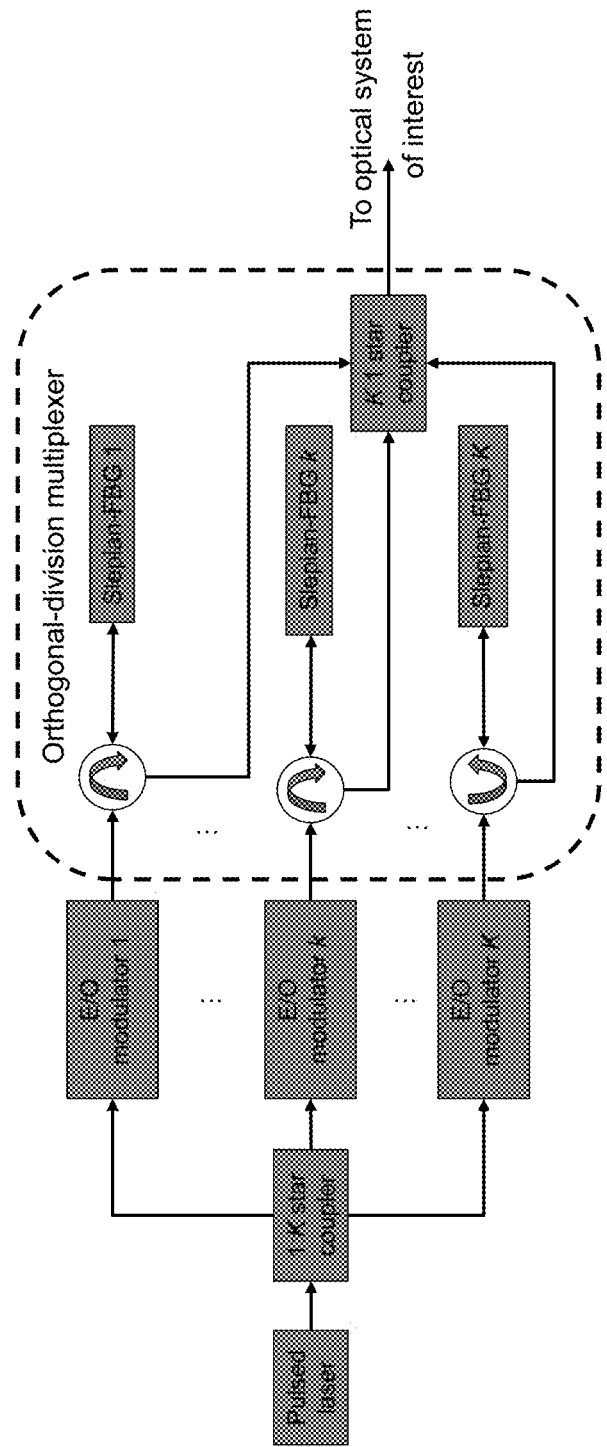
FIGS. 5A-5B shows exemplary transmitter and receiver architectures for orthogonal division multiplexing (ODM). The notation on figures is as follows. E/O modulator: electro-optical modulator (Mach-Zehnder modulator, phase modulator, or I/Q modulator)
Figure 5B:
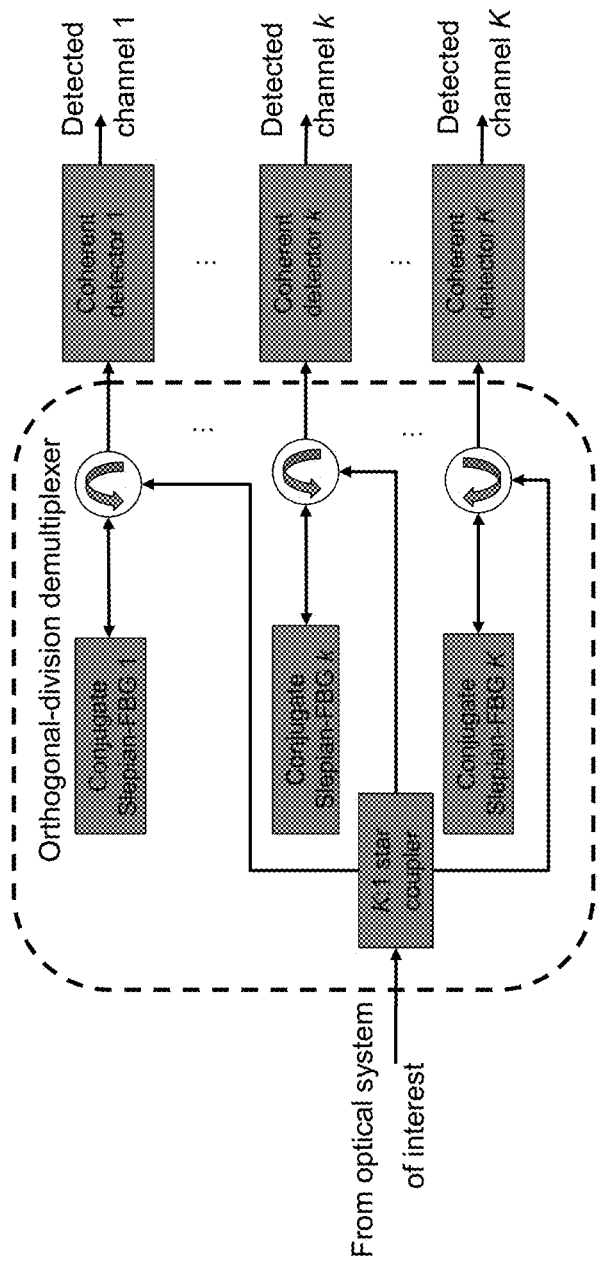

The configuration of transmitter and receiver for orthogonal division multiplexing (ODM) are shown in FIGS. 5A and 5B, respectively. The FBGs can be used to obtain target Slepian-like impulse responses. The pulse laser output is split into K branches (see FIG. 5A). Every branch is used as input of an electro-optical (E/O) modulator such as Mach-Zehnder (MZ), phase, I/Q modulator, or 4-D modulator. The output of the k-th modulator (k=1,2, . . . ,K) is used as the input the k-th Slepian-FBG, indicating that independent data streams are imposed on orthogonal impulse responses. The outputs of corresponding Slepian-FBGs are combined by K:1 star coupler and transmitted to remote destination over either fiber-optics of free-space optical (FSO) system of interest. On receiver side, as shown in FIG. 6B, the independent data streams are separated by corresponding conjugate Slepian-FBGs, whose outputs are used as inputs of corresponding coherent detectors. This scheme is applicable to any modulation format. Since the orthogonal-division demultiplexing is performed in optical domain, both coherent and direct detections can be used. Finally, the system is compatible with both SMF and spatial division multiplexing (SDM) applications.

To demonstrate high potential of the spectral-ODM multiplexed LDPC-coded $p^m$-ary signaling scheme, we perform Monte Carlo C++ simulations for information symbol rate per single-band of 25 GS/s. The simulation results, summarized in FIG. 6 and are obtained by averaging over all bands, ODM signals. The aggregate data rate for LDPC-coded 125-ary constellation with spectral-orthogonal-division multiplexing with $N_1=15$, $N_2=10$, $N_3=20$ is 1.045 Pb/s. Clearly, beyond 1 Pb/s serial optical transport (over SMFs) can be achieved by employing commercially available electronics and $p^m$-ary signaling for reasonable OSNR-values. The LDPC (16935, 13550) code of rate 0.8 and column-weight 3 is used in simulations for 20 LDPC iterations. It is interesting to notice that LDPC-coded 9-ary scheme of higher spectral efficiency outperforms LDPC-coded 8-QAM by almost 1 dB at BER of $10^{-8}$.

The signal frame is organized into 10 band-groups with center frequencies being orthogonal to each other. Each spectral component carries 1 TbE, while each spectral band group carries 10 TbE traffic. We employ a three-step hierarchical architecture with a building block being 1 Tb/s superchannel signal. Next, 1 TbE spectral slots are arranged in spectral band-groups to enable up to 10 TbE. By combining two (four) spectral band-groups, the scheme can enable 20 TbE (40 TbE). The second layer is related to spectral-division multiplexing, resulting in 100 Tb/s aggregate data rate per orthogonal-division multiplexer input, corresponding to 100 TbE. By combining two/four/ten such obtained signals by using the orthogonal-division multiplexer, the scheme is compatible with future 200 TbE/400 TbE/1 PbE.

Figure 6:
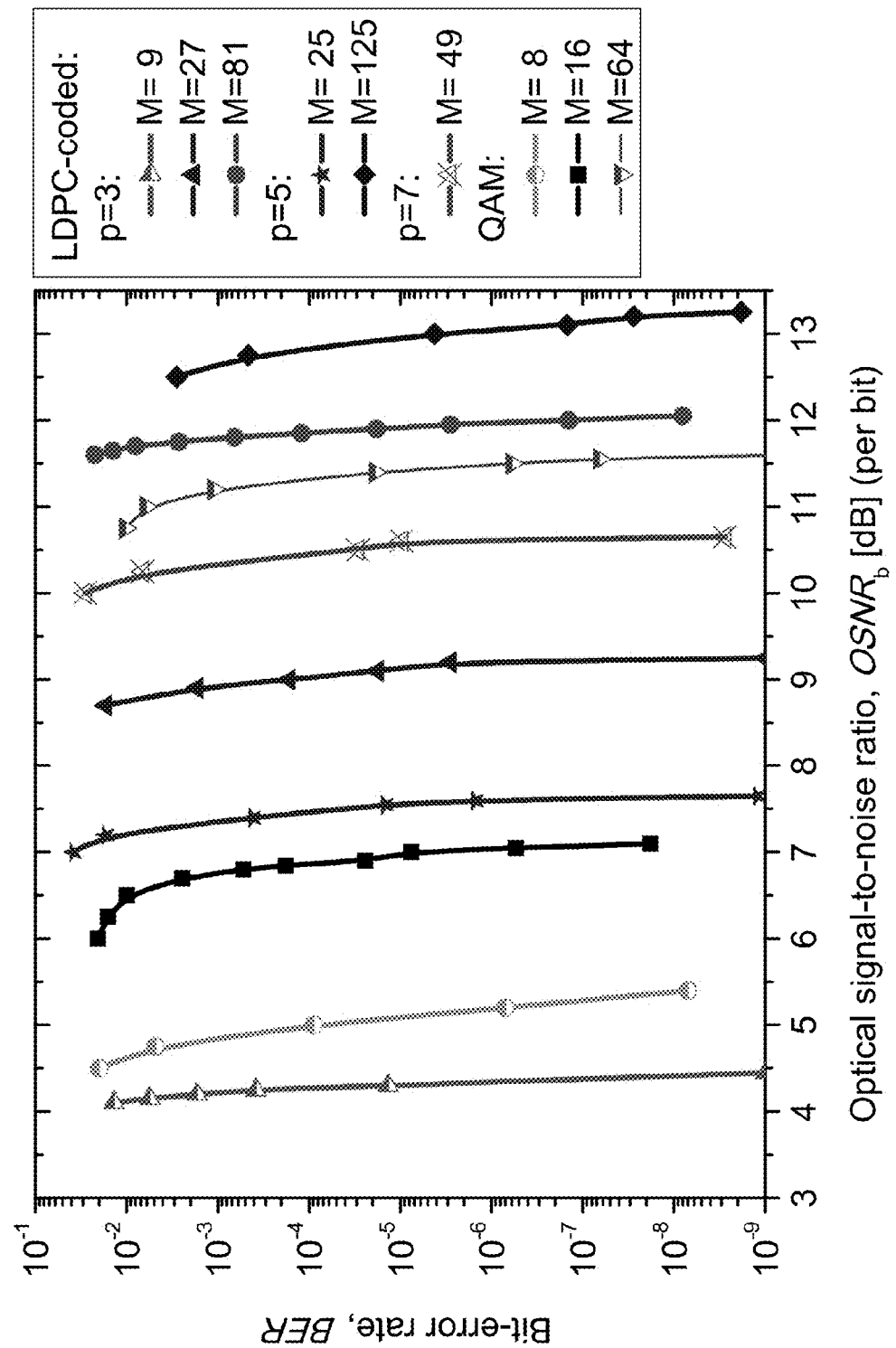
FIG. 6 shows exemplary BERs performance of LDPC coded multinary schemes with spectral- and orthogonal-division multiplexing.

FIG. 6 shows BERs performance of LDPC coded multinary schemes with spectral- and orthogonal-division multiplexing. As a solution to limited bandwidth of information infrastructure, high power consumption, and heterogeneity of network segments, we use multinary signaling based coded modulation. With $p^m$-ary signaling, where p>2, we can improve the spectral of conventional $2^m$-ary schemes by $\log_2 p$ times for the same bandwidth occupancy. At the same time the energy efficiency of $p^m$-ary signaling scheme has been shown to be much better than that of $2^m$-ary signaling scheme based on binary representation of data. We have demonstrated in FIG. 6 that the multinary signaling based coded modulation together with energy-efficient signal constellation design, spectral-multiplexing, polarization-division multiplexing, and orthogonal-division multiplexing we can achieve beyond 1 Pb/s serial optical transport without a need for introduction of spatial-division multiplexing.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated in this disclosure, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, or compositions, which can, of course, vary. It is also to be understood that the terminology used in this disclosure is for the purpose of describing particular embodiments only, and is not intended to be limiting.

With respect to the use of substantially any plural and/or singular terms in this disclosure, those having skill in the art can translate from the plural to the singular and/or from the singular to the plural as is appropriate to the context and/or application. The various singular/plural permutations may be expressly set forth in this disclosure for sake of clarity.

It will be understood by those within the art that, in general, terms used in this disclosure, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed in this disclosure also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed in this disclosure can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, it will be appreciated that various embodiments of the present disclosure have been described for purposes of illustration, and that various modifications may be made without departing from the scope and spirit of the present disclosure. Accordingly, the various embodiments disclosed are not intended to be limiting, with the true scope and spirit being indicated by the following claims.

What is claimed is:

1. A method for communication using an optical transmission system having optical transmitters and receivers, comprising:
   performing a low-density parity-check (LDPC) encoding;
   performing nonbinary $p^m$-ary signaling, where p is a prime larger than 2;
   taking m p-ary symbols at a time and selecting a point from $p^m$-ary signal constellation;
   after up-sampling and driving amplification, using coordinates of the $p^m$-ary constellation as input of I/Q modulator x (y);
   combining two independent $p^m$-ary streams corresponding to x and y-polarization states by a polarization beam combiner (PBS)
   transmitting data over the optical transmission system; and
   improving a spectral efficiency of $2^m$-ary schemes by at least $\log_2 p$ times for the same bandwidth occupancy.

2. The method of claim 1, comprising applying $p^m$-ary signaling in combination with an energy-efficient signal constellation, further comprising applying spectral-multiplexing, polarization-division multiplexing, and orthogonal division multiplexing (ODM) to achieve multi-Pb/s serial optical transport without spatial-division multiplexing (SDM).

3. The method of claim 1, comprising applying Slepian sequences that are mutually orthogonal, while occupying a fixed bandwidth to provide an additional degree of freedom with a predesigned fiber Bragg gratings (FBGs).

4. The method of claim 3, comprising randomly selecting an FBG with impulse response from a set of Slepian sequences to ensure that transmitted sequence is secure as the FBG is not known to a third party.

5. The method of claim 1, comprising providing all optical data encryption.

6. The method of claim 1, comprising $$\lambda(s_i^{(x,y)}) = \log\left[\frac{P(s_i^{(x,y)} | r^{(x,y)})}{P(s_0 | r^{(x,y)})}\right], r^{(x,y)} = I'_{x,y} + jQ'_{x,y}$$

where $s_i^{(x,y)}$ is the transmitted $p^m$-ary signal constellation point at time instance i in either x- or y-polarization, while $s_0$ is the reference constellation point, and $r^{(x,y)}$ is the received vector.

7. The method of claim 6, comprising determining $$P(s_i^{(x,y)} | r^{(x,y)}) = \frac{P(r^{(x,y)} | s_i^{(x,y)}) P(s_i^{(x,y)})}{\sum_{s'} P(r^{(x,y)} | s') P(s')},$$

where $P(s_i^{(x,y)})$ is the prior probability equal to to $1/p^m$ for uniform signaling, and the conditional probability $P(r^{(x,y)}|s_i^{(x,y)})$ is obtained by estimation of histograms in the presence of uncompensated nonlinear effects.

8. The method of claim 1, comprising a j-th bit LLR of symbol $s_i^{(x,y)}$ from symbol LLRs by $$L(\hat{s}_{ij}^{(x,y)}) = \log \frac{\sum_{s_i^{(x,y)}:s_{ij}^{(x,y)}=0} \exp[\lambda(s_i^{(x,y)})] \exp\left(\sum_{s_i^{(x,y)}:s_{ik}^{(x,y)}=0, k \neq j} L_a(s_{ik}^{(x,y)})\right)}{\sum_{s_i^{(x,y)}:s_{ij}^{(x,y)}=1} \exp[\lambda(s_i^{(x,y)})] \exp\left(\sum_{s_i^{(x,y)}:s_{ik}^{(x,y)}=0, k \neq j} L_a(s_{ik}^{(x,y)})\right)},$$

where with $L_a(s_{ik}^{(x,y)})$ we denoted the prior (extrinsic) information determined from the $p^m$-ary APP demapper, The j-th position reliability is calculated as the logarithm of the ratio of a probability that $s_{ij}^{(x,y)}=0$ and probability that $s_{ij}^{(x,y)}=1$, In the nominator, the summation is done over all symbols $s_{ij}^{(x,y)}$ having 0 at the position j, while in the denominator over all symbols $s_i^{(x,y)}$ having 1 at the position j, The inner summation is performed over all positions of symbol $s_i^{(x,y)}$, selected in the outer summation, for which $s_{ik}^{(x,y)}=0$, $k \neq j$, The j-th position LLRs are forwarded to corresponding binary LDPC decoder.

9. The method of claim 1, comprising determining the prior $p^m$-ary symbol log-l-likelihood ratio estimate from $$\lambda_a(\hat{s}_i^{(x,y)}) = \sum_{j=0}^{b-1} L_{D,e}(\hat{s}_{ij}), L_{D,e}(\hat{s}_{ij}^{(x,y)}) = L(s_{ij}^{(t)}) - L(s_{ij}^{(t-1)})$$

where $L(s_{ij}^{(t)})$ denotes an LDPC decoder output in iteration t, $L_{D,e}(s_{ij})$ is the decoder extrinsic log-likelihood ratio of the j-th bit in the i-th symbol, The number of bits required to represent one $p^m$-ary symbol is denoted by b.

10. The method of claim 9, comprising iterating between the $p^m$-ary APP demapper and BI LDPC decoder is performed until a maximum number of iterations is reached, or valid codewords are obtained.

11. The method of claim 1, wherein the multinary signal constellation algorithm is employed to generate $p^m$ary signal constellations comprising using an Arimoto-Blahut algorithm to determine the optimum source distribution for a given optical channel, initializing the algorithm with a set of initial constellation points obtained from conventional QAM, generating training sequences from optimum source distribution and split them into the clusters of points according to the maximum of log-likelihood ratios from constellation obtained in previous iteration, and obtaining new constellation points as the center of mass of obtained clusters.

12. The method of claim 1, comprising receiving transmitted over fiber-optic channel data after orthogonal-division demultiplexing, where every ODM projection is forwarded to an all-optical OFDM receiver followed by the polarization-diversity receiver which provides projections along polarizations and in-phase/quadrature channels.

13. The method of claim 12, comprising using the all-optical OFDM for multiplexing of independent optical signals over orthogonal optical OFDM supercarriers rather than for modulation.

14. The method of claim 13, wherein in ODM receiver the independent data streams are separated by corresponding conjugate Slepian-FBGs, whose outputs are used as inputs of corresponding coherent detectors.

15. The method of claim 12, wherein the proposed multinary coded modulation schemes provide finer granularity in spectral efficiency compared to conventional constellations (with signal constellation size being power of 2) indicating that the scheme are suitable for adaptive modulation and coding.

16. The method of claim 12, wherein ODM transmitter employs FBGs to obtain target Slepian-like impulse responses, wherein a pulse laser output is split into K branches and every branch is used as input of an electro-optical (E/O) modulator and outputs of corresponding Slepian-FBGs are combined by K:1 star coupler and transmitted to remote destination over either fiber-optics of free-space optical (FSO) system of interest.

17. The methods as of claim 12, where for more than two dimensions the Slepian sequences generated in electrical domain are used as the electrical basis functions, replacing in-phase and quadrature signals.

18. The methods of claim 12, wherein the signal frame is organized into 10 band-groups with center frequencies being orthogonal to each other, wherein each spectral component carries 1 TbE, while each spectral band group carries 10 TbE traffic.

19. A method for communication using an optical transmission system having optical transmitters and receivers, comprising:
performing a low-density parity-check (LDPC) encoding;
performing nonbinary $p^m$-ary signaling, where p is a prime larger than 2;
taking m p-ary symbols at a time and selecting a point from $p^m$-ary signal constellation;
after up-sampling and driving amplification, using coordinates of the $p^m$-ary constellation as input of I/Q modulator x (y);
combining two independent $p^m$-ary streams corresponding to x and y-polarization states by a polarization beam combiner (PBS);
transmitting data over the optical transmission system; and
applying an energy-efficient coded modulation for $p^m$-ary signaling.

20. A method for communication using an optical transmission system having optical transmitters and receivers, comprising:
performing a low-density parity-check (LDPC) encoding;
performing nonbinary $p^m$-ary signaling, where p is a prime larger than 2;
taking m p-ary symbols at a time and selecting a point from $p^m$-ary signal constellation;
after up-sampling and driving amplification, using coordinates of the $p^m$-ary constellation as input of I/Q modulator x (y);
combining two independent $p^m$-ary streams corresponding to x and y-polarization states by a polarization beam combiner (PBS);
transmitting data over the optical transmission system and using spatial modes, in tandem with multinary signaling based coded modulation to achieve beyond 10 Pb/s serial optical transport.

* * * * *